(12) United States Patent
Ba et al.

(10) Patent No.: US 12,014,928 B2
(45) Date of Patent: Jun. 18, 2024

(54) MULTI-LAYER FEATURE FILL

(71) Applicant: Lam Research Corporation, Fremont, CA (US)

(72) Inventors: Xiaolan Ba, San Jose, CA (US); Ruopeng Deng, San Jose, CA (US); Juwen Gao, San Jose, CA (US); Sanjay Gopinath, Fremont, CA (US); Lawrence Schloss, Palo Alto, CA (US)

(73) Assignee: Lam Research Corporation, Fremont, CA (US)

(*) Notice: Subject to any disclaimer, the term of this patent is extended or adjusted under 35 U.S.C. 154(b) by 575 days.

(21) Appl. No.: 17/250,503

(22) PCT Filed: Jul. 31, 2019

(86) PCT No.: PCT/US2019/044541
§ 371 (c)(1),
(2) Date: Jan. 29, 2021

(87) PCT Pub. No.: WO2020/028587
PCT Pub. Date: Feb. 6, 2020

(65) Prior Publication Data
US 2021/0313183 A1 Oct. 7, 2021

Related U.S. Application Data

(60) Provisional application No. 62/712,863, filed on Jul. 31, 2018.

(51) Int. Cl.
*H01L 21/285* (2006.01)
*C23C 10/04* (2006.01)
(Continued)

(52) U.S. Cl.
CPC ...... *H01L 21/28568* (2013.01); *C23C 16/045* (2013.01); *C23C 16/14* (2013.01);
(Continued)

(58) Field of Classification Search
None
See application file for complete search history.

(56) References Cited

U.S. PATENT DOCUMENTS

| 5,028,565 A | 7/1991 | Chang et al. |
| 5,661,080 A | 8/1997 | Hwang et al. |

(Continued)

FOREIGN PATENT DOCUMENTS

| JP | 2005150416 A | 6/2005 |
| JP | 2011035366 A | 2/2011 |

(Continued)

OTHER PUBLICATIONS

Office Action dated Feb. 8, 2005 issued in U.S. Appl. No. 10/649,351.
(Continued)

*Primary Examiner* — Asok K Sarkar
(74) *Attorney, Agent, or Firm* — Weaver Austin Villeneuve & Sampson LLP

(57) ABSTRACT

Described herein are methods and apparatuses for filling semiconductor substrate structures with conductive material. The methods involve depositing multi-layer bulk metal films in structures with one or more deposition conditions changed when transitioning from layer-to-layer. The methods result in high fill quality, high throughput, low precursor consumption, and low roughness. Multi-station chambers to perform the methods are also provided.

17 Claims, 8 Drawing Sheets

(51) Int. Cl.

| | |
|---|---|
| *C23C 16/04* | (2006.01) |
| *C23C 16/14* | (2006.01) |
| *C23C 16/455* | (2006.01) |
| *H01L 21/768* | (2006.01) |
| *H01L 23/532* | (2006.01) |
| *H10B 41/27* | (2023.01) |
| *H10B 43/27* | (2023.01) |

(52) U.S. Cl.
CPC .. *C23C 16/45527* (2013.01); *C23C 16/45544* (2013.01); *H01L 21/76805* (2013.01); *H01L 21/76895* (2013.01); *H01L 23/53209* (2013.01); *H01L 23/53242* (2013.01); *H01L 23/53257* (2013.01); *H10B 41/27* (2023.02); *H10B 43/27* (2023.02)

(56) References Cited

U.S. PATENT DOCUMENTS

| | | | |
|---|---|---|---|
| 5,795,824 | A | 8/1998 | Hancock |
| 5,804,249 | A | 9/1998 | Sukharev et al. |
| 5,956,609 | A | 9/1999 | Lee et al. |
| 6,066,366 | A | 5/2000 | Berenbaum et al. |
| 6,107,200 | A | 8/2000 | Takagi et al. |
| 6,143,082 | A | 11/2000 | McInerney et al. |
| 6,635,965 | B1 | 10/2003 | Lee et al. |
| 7,141,494 | B2 | 11/2006 | Lee et al. |
| 2002/0090796 | A1 | 7/2002 | Desai et al. |
| 2003/0059980 | A1 | 3/2003 | Chen et al. |
| 2003/0104126 | A1 | 6/2003 | Fang et al. |
| 2003/0127043 | A1 | 7/2003 | Lu et al. |
| 2005/0031786 | A1 | 2/2005 | Lee et al. |
| 2008/0014352 | A1 | 1/2008 | Xi et al. |
| 2008/0227291 | A1 | 9/2008 | Lai et al. |
| 2015/0024592 | A1 | 1/2015 | Chandrashekar et al. |
| 2015/0179461 | A1 | 6/2015 | Bamnolker et al. |
| 2016/0118345 | A1 | 4/2016 | Chen et al. |
| 2016/0181272 | A1 | 6/2016 | Rabkin et al. |
| 2018/0053660 | A1 | 2/2018 | Jandl et al. |
| 2018/0142345 | A1 | 5/2018 | Meng et al. |
| 2019/0019725 | A1 | 1/2019 | Chandrashekar et al. |
| 2021/0140048 | A1* | 5/2021 | Moon ............... H01L 21/28088 |
| 2022/0375792 | A1 | 11/2022 | Schloss et al. |

FOREIGN PATENT DOCUMENTS

| | | |
|---|---|---|
| JP | 2015029097 A | 2/2015 |
| WO | WO 01/27347 A1 | 4/2001 |
| WO | WO 2015/023404 A1 | 2/2015 |
| WO | WO 2018/191183 A1 | 10/2018 |

OTHER PUBLICATIONS

Final Office Action dated Jul. 14, 2005 issued in U.S. Appl. No. 10/649,351.
Office Action dated Dec. 30, 2005 issued in U.S. Appl. No. 10/649,351.
Notice of Allowance dated Jul. 21, 2006 issued in U.S. Appl. No. 10/649,351.
International Search Report and Written Opinion dated Nov. 27, 2019 issued in Application No. PCT/US2019/044541.
International Preliminary Report on Patentability dated Feb. 11, 2021 issued in Application No. PCT/US2019/044541.
International Search Report and Written Opinion dated Jan. 19, 2005 issued in Application No. PCT/US2004/006940.
International Preliminary Report on Patentability dated Mar. 9, 2006 issued in Application No. PCT/US2004/006940.
Korean First Office Action [Translation Only] dated Dec. 8, 2010 issued in Application No. KR 2004-0036346.
Korean Second Office Action [Translation Only] dated Aug. 25, 2011 issued in Application No. KR 2004-0036346.
Korean First Office Action dated Jun. 13, 2011 issued in Application No. KR 2011-0032098.
International Search Report and Written Opinion dated Feb. 3, 2021 issued in Application No. PCT/US2020/055596.
Klaus, et al., "Atomically controlled growth of tungsten and tungsten nitride using sequential surface reactions" Applied Surface Science, 162-163 (2000) 479-491.
International Preliminary Report on Patentability dated Apr. 28, 2022, in PCT Application No. PCT/US2020/055596.
JP Office Action dated Oct. 3, 2023 in Application No. JP2022-522581 with English Translation.
JP Office Action dated Oct. 3, 2023 in Application No. JP2023-95239 with English Translation.
U.S. Appl. No. 17/763,529, inventors Schloss et al., filed Mar. 24, 2022.
JP Office Action dated Feb. 20, 2024 in JP Application No. 2023-547183 with English translation.
JP Office Action dated Feb. 27, 2024 in Application No. JP2022-522581 with English Translation.
CN Office Action dated Feb. 28, 2024 in CN Application No. 201980051278.2, with English Translation.

* cited by examiner

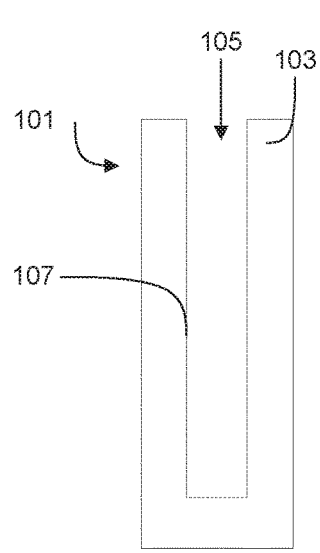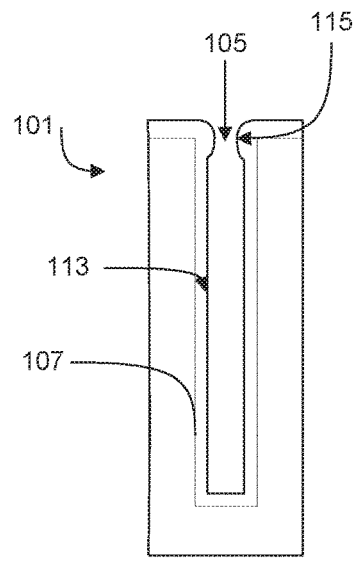
FIG. 1A  FIG. 1B
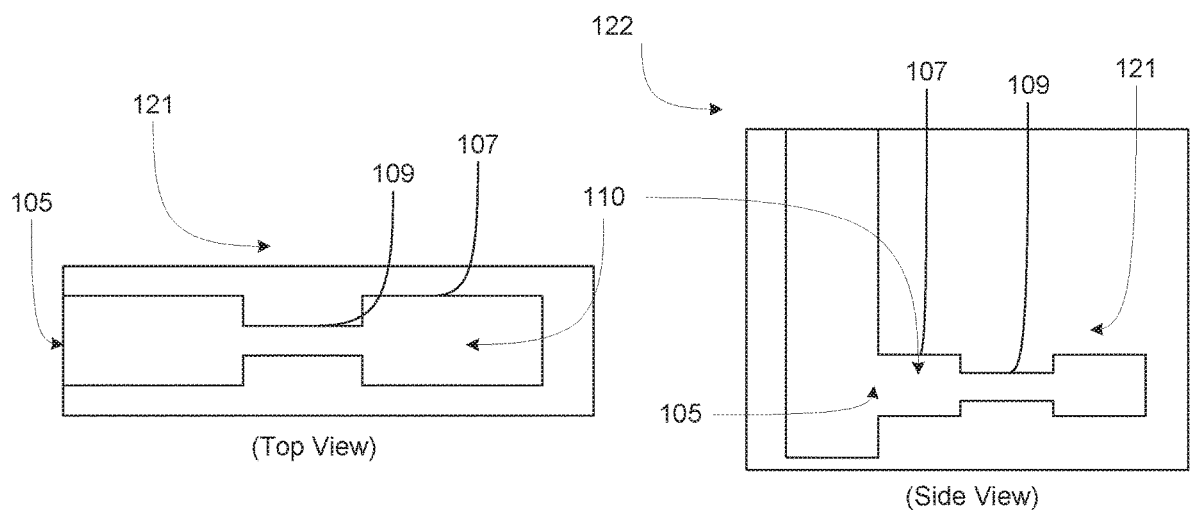
FIG. 1C
FIG. 1D

MULTI-LAYER FEATURE FILL

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Deposition of tungsten and other metal-containing materials is an integral part of many semiconductor fabrication processes. These materials may be used for horizontal interconnects, vias between adjacent metal layers, and contacts between metal layers and devices. However, as devices shrink and more complex patterning schemes are utilized in the industry, deposition of thin tungsten films becomes a challenge. Deposition in complex high aspect ratio structures such as 3D NAND structures is particularly challenging.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclosure relates to a method of filling a 3-D structure of a partially manufactured semiconductor substrate with a conductive material, the 3-D structure including sidewalls, a plurality of openings in the sidewalls leading to a plurality of features having a plurality of interior regions fluidically accessible through the openings, the method including: depositing a first bulk layer of the conductive material within the 3-D structure such that the first bulk layer partially fills the plurality of interior regions of the 3-D structure; depositing a second bulk layer of the conductive material within the 3-D structure on the first bulk layer such that the second bulk layer at least partially fills the plurality of interior regions of the 3-D structure; and depositing a third bulk layer of the conductive material within the 3-D structure on the sidewalls, where the first bulk layer, second bulk layer, and third bulk layer are deposited at different conditions. According to various embodiments, the methods may include one or more of the following features. The method where the conductive material is tungsten. The method where the first and second bulk layers are deposited by atomic layer deposition (ALD) processes. The method where third bulk layer is deposited by an ALD process. The method where the third bulk layer is deposited by a chemical vapor deposition (CVD) process. The method where each of the ALD processes includes sequential pulses of a metal-containing precursor and a reducing agent. The method where one or more of the flow rate and the pulse time of the metal-containing precursor pulse is greater during deposition of the first bulk layer. The method further including depositing a fourth bulk layer of the conductive on the third bulk layer. The method where the conductive material is molybdenum, ruthenium, or cobalt. The method further including exposing the substrate to a nitrogen (N2) soak in between deposition of two of the bulk layers.

Another aspect of the disclosure relates to a method including: providing a substrate to a multi-station deposition chamber; depositing in a first station of the multi-station deposition chamber a first metal bulk layer on the substrate at a first set of conditions; transferring the substrate to a second station of the multi-station deposition chamber and depositing a second metal bulk layer on the first bulk layer at a second set of conditions; transferring the substrate to a third station of the multi-station deposition chamber and depositing a third metal bulk layer on the second bulk layer at a third set of conditions, where transitioning from the first set of conditions to the second set of conditions includes one or more of: changing a metal precursor pulse time, changing a metal precursor flowrate, and changing a pedestal temperature, and transitioning from the second set of conditions to the third set of conditions includes one or more of: changing a metal precursor pulse time, changing a metal precursor flowrate, and changing a pedestal temperature. Changing a process condition (e.g., a pedestal temperature) involves setting different conditions at the different stations; e.g., a first pedestal temperature at a first station and a second pedestal temperature at a second station.

According to various embodiments, the methods may include one or more of the following features. The method where the metal is one of tungsten, molybdenum, cobalt, and ruthenium. The method where transitioning from the first set of conditions to the second set of conditions includes increasing a metal precursor flowrate or increasing a metal precursor pulse time. The method where transitioning from the first set of conditions to the second set of conditions includes increasing a purge time. The method where transitioning from the first set of conditions to the second set of conditions includes decreasing a metal precursor flowrate or decreasing a metal precursor pulse time.

Another aspect of the disclosure relates to a multi-station chamber including: a first station including a first showerhead and a first pedestal; a second station including a second showerhead and a second pedestal; a first station including a third showerhead and a third pedestal; and a controller including machine-readable instructions to: deposit in the first station of the multi-station deposition chamber a first metal bulk layer on the substrate at a first set of conditions; transfer the substrate to the second station of the multi-station deposition chamber and deposit a second metal bulk layer on the first bulk layer at a second set of conditions; transfer the substrate to the third station of the multi-station deposition chamber and deposit a third metal bulk layer on the second bulk layer at a third set of conditions, where transitioning from the first set of conditions to the second set of conditions includes one or more of: changing a metal precursor pulse time, changing a metal precursor flowrate, and changing a pedestal temperature, and transitioning from the second set of conditions to the third set of conditions includes one or more of: changing a metal precursor pulse time, changing a metal precursor flowrate, and changing a pedestal temperature.

These and other aspects are described further below with reference to the drawings.

BRIEF DESCRIPTION OF DRAWINGS

FIG. 1A shows a cross-section of a vertical feature in a substrate which may be designed to be filled with tungsten or other conductive material according to various embodiments.

FIG. 1B shows an example of a similar feature to FIG. 1A, but having a re-entrant profile, due to the presence of an under-layer lining the bottom, sidewalls, and opening of the feature.

FIG. 1C illustrates a top-down plan view of a horizontal feature exhibiting a constriction roughly in the middle of its sidewall that may be filled with tungsten or other conductive material according to various embodiments. In some embodiments, such horizontal features may be what are referred to as wordline features in a vertically integrated memory structure.

FIG. 1D illustrates a side-view of the same horizontal feature shown in FIG. 1C, but here shown having an opening to a vertical structure, and thus forming a part of vertical structure.

DESCRIPTION

Figure 2A:
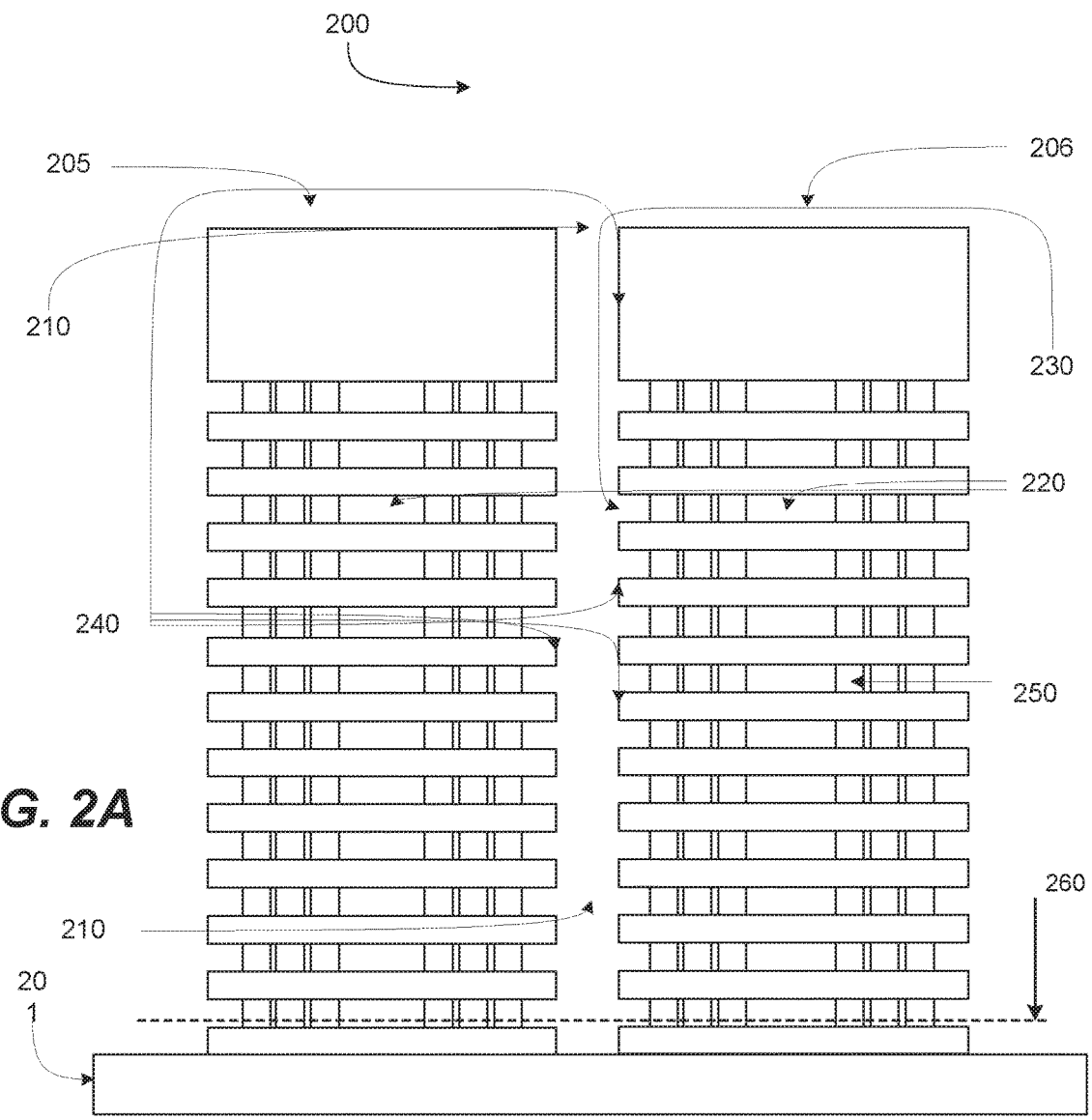
FIG. 2A presents a cross-sectional side-view of a 3D vertical memory NAND (VNAND) structure (formed on a semiconductor substrate) having VNAND stacks (left and right), a central vertical structure, and a plurality of stacked horizontal features with openings on opposite sidewalls of central vertical structure.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Metal fill of features is used in semiconductor device fabrication to form electrical contacts. In some deposition processes, a metal nucleation layer is first deposited into the feature. In general, a nucleation layer is a thin conformal layer that serves to facilitate the subsequent formation of a bulk material thereon. The nucleation layer may be deposited to conformally coat the surfaces (sidewalls and, if present, bottom) of the feature. Conforming to these surfaces can be critical to support high quality deposition. Nucleation layers are often deposited using atomic layer deposition (ALD) methods.

In an ALD technique, pulses of reactant are sequentially injected to the reaction chamber. The pulses may be purged from the reaction chamber, typically by a pulse of a purge gas between reactants. A first reactant can be adsorbed onto the substrate, available to react with the next reactant. The process is repeated in a cyclical fashion until the desired thickness is achieved. Using sequential pulses of reactants to deposit nucleation layers may also be referred to as a pulsed nucleation layer (PNL) technique. In the context of the disclosed embodiments, chemical vapor deposition (CVD) embodies processes in which reactants are together introduced to a reactor for a vapor-phase or surface reaction. PNL and ALD processes are distinct from CVD processes and vice versa.

After the metal nucleation layer is deposited, bulk metal may be deposited by a CVD or ALD process. A bulk metal film is different from a metal nucleation layer. Bulk metal as used herein refers to metal used to fill most or all of a feature, such as at least about 50% of the feature. Unlike a nucleation layer, which is a thin conformal film that serves to facilitate the subsequent formation of a bulk material thereon, the bulk metal is used to carry current. It may be characterized by larger grain size and lower resistivity as compared to a nucleation film. In various embodiments, bulk material is deposited to a thickness of at least 50 Å.

There are various challenges in tungsten fill as devices scale to smaller technology nodes and more complex patterning structures are used. For example, conventional deposition of tungsten has involved the use of the fluorine-containing precursor tungsten hexafluoride ($WF_6$). However, the use of $WF_6$ results in some incorporation of fluorine into the deposited tungsten film. The presence of fluorine can cause electro-migration and/or fluorine diffusion into adjacent components and damage contacts, thereby reducing the performance of the device. One challenge is reducing the fluorine content in a deposited tungsten film. The effect of a certain fluorine concentration increases as feature size decreases. This is because thinner films are deposited in smaller features with fluorine in the deposited tungsten film more likely to diffuse through thinner films.

Another challenge is achieving uniform step coverage, especially when depositing into high aspect ratio and complex structures such as 3D NAND structures. This is because it can be difficult to obtain uniform exposure to the deposition gases, particularly when some parts of the structure are more easily accessed by the deposition gases. Deposition in small features or features having a high aspect ratio may cause the formation of voids within the deposited tungsten. A void is a region within a structure or feature which is left unfilled after surrounding regions have been filled. Often, void formation is caused by a disproportionate accumulation of deposited material near a feature's entrance, resulting in the entrance becoming blocked and pinching off the interior volume of the feature preventing further deposition within the interior volume. Once blocked or pinched off, reactive deposition precursor species have no entry path into the interior volume precluding any further deposition within these regions from occurring.

Described herein are methods, apparatuses, and systems for filling of semiconductor substrate structures with conductive material. One or more of the following advantages may be realized by implementations of the methods described herein. In some embodiments, good (i.e., low void) fill is achieved in challenging to fill structures. In the same or other embodiments, precursor consumption is controlled and may be balanced over a multi-layer process to minimize overall consumption. In the same or other embodiments, throughput is increased.

As indicated above, a significant problem associated with the filling of semiconductor substrate structures and features with tungsten material is the formation of seams and voids during the tungsten fill process. In particular, structures having features having one or more of narrow and/or re-entrant openings, or constrictions, or simply having relatively high aspect ratios may be problematic. FIG. 1A shows the cross-section of a vertical feature 101 in a substrate 103 which may filled with tungsten material. Such a vertical feature has a feature opening 105 and sidewalls 107. The vertical feature 101 may have an aspect ratio of at least about 2:1, or at least about 4:1, or at least about 6:1, or at least about 10:1, or at least about 20:1, or even higher. The feature opening 105 may have a diameter of between about 10 nanometers to 500 nanometers, for example, between about 25 to 300 nanometers.

Likewise, FIG. 1B shows an example of a similar feature 101, but having a re-entrant profile, due to the presence of an under-layer 113 lining the bottom, sidewalls, and opening of feature 101. A re-entrant profile is one exhibiting a cross-sectional narrowing somewhere between the feature opening and the bottom or a closed end of the feature thereby exhibiting a "bottleneck" in the profile. In some cases, a re-entrant profile may narrow gradually from feature opening inward, or include an overhang right at the feature opening itself. FIG. 1B shows an example of the latter-again, wherein the narrowing is due to the presence of underlayer 113, which is thicker near the feature opening than on the bottom of the feature or further down the feature sidewalls 107, and thereby forms the overhang 115. The under-layer 113 may be, for example, a diffusion barrier layer, an adhesion layer, a nucleation layer, or any combination of the foregoing, or any other potentially useful or advantageous layer of material.

In some embodiments, one or more constrictions in the sidewalls of a feature may create difficulty in achieving uniform tungsten fill. FIG. 1C illustrates a top-down plan view of an example horizontal feature 121 exhibiting a constriction 109 roughly in the middle of its sidewall 107 inhibiting access to an interior region 110. In some embodiments, such horizontal features may be what is referred to as a "wordline" in a vertically integrated memory structure such as one of the 3-D vertical NAND (VNAND) structures described in more detail below. FIG. 1D illustrates a side-view of the same horizontal feature 121 having an opening 105 to vertical structure 122, and thus forming a part of vertical structure 122. In some embodiments, and for some deposition chemistries and processes, achieving uniform tungsten fill in such a structure may be challenging because a sufficient quantity of each species of deposition precursor must travel vertically down to the base of structure 122, and then horizontally through horizontal feature 121 and, in particular, through the region of constriction 109. Once again, note that FIG. 1C presents a top-down plan view representation of horizontal feature 121 and constriction 109, while FIG. 1D presents a side-view representation of the same. Thus, it is apparent from these figures that, in this embodiment, constriction 109 extends inward horizontally and vertically from sidewalls 107 of feature 121. However, it should be understood that, in other embodiments, constrictions within a feature may only be present in one of the two cross-sectional dimensions, and any type of constriction-whether it be in one or two dimensions—may make uniform tungsten fill more challenging.

The methods, apparatuses, and systems described herein may be used to fill vertical features—a via, for instance-as well as horizontal features, such as the horizontal wordlines within a vertical NAND (VNAND) structure—to be described in more detail below. The substrates having structures or features to be filled may be 200, 300, or 450 mm semiconductor wafers, or wafers having diameters between about 200 and 300 mm, or between about 300 and 450 mm, or greater than about 450 mm, or any appropriately sized wafer. Moreover, the methods, apparatuses, and systems, may be used to fill features with tungsten on other types of substrates, including panels, display substrates, and the like. Although the below description refers chiefly to tungsten, the methods and apparatuses may also be used for fill of any metal that can be deposited using CVD and ALD techniques including molybdenum, ruthenium, and cobalt.

In some embodiments, the structure to be filled on a semiconductor substrate may be a vertical structure having a plurality of horizontal features with openings in the sidewalls of the vertical structure—the openings leading to a plurality of interior volumes (of the horizontal features) which are fluidically accessible from the main vertical structure through the feature openings.

For instance, FIG. 2A presents a cross-sectional side-view of a 3D vertical memory NAND (VNAND) structure 200 (formed on a semiconductor substrate 201) having VNAND stacks (left 205 and right 206), central vertical structure 210, and a plurality of stacked horizontal features 220 with openings 230 on opposite sidewalls 240 of central vertical structure 210. Note that FIG. 2A displays two "stacks" of the exhibited VNAND structure, which together form the "trench-like" central vertical structure 210, however, in certain embodiments, there may be more than two "stacks" arranged in sequence and running spatially parallel to one another, the gap between each adjacent pair of "stacks" forming a central vertical structure 210, like that explicitly illustrated in FIG. 2A. In this embodiment, the horizontal features 220 are actually 3D memory "wordlines" which are fluidically accessible from vertical structure 210 through openings 230. Although not explicitly indicated in the figure, the horizontal features 220 present in both the VNAND stacks 205, 206 shown in FIG. 2A (i.e., the left VNAND stack and the right VNAND stack 206) are also accessible from the other sides of the VNAND stacks (far left and far right, respectively) through similar vertical structures formed by additional VNAND stacks (to the far left and far right, but not shown). In other words, each VNAND stack 205, 206 contains a stack of wordlines which are fluidically accessible from both sides of the VNAND stack through a central vertical structure 210. In the particular example schematically illustrated in FIG. 2A, each VNAND stack contains 6 pairs of stacked wordlines, however, in other embodiments, a 3-D VNAND memory layout may contain 8, or 16, or 32, or 64 vertically stacked pairs of wordlines corresponding to 16, or 32, or 64, or 128 stacked horizontal wordline features 220 with openings 230. Note that the wordlines in a VNAND stack are typically formed by depositing an alternating stack of silicon oxide and silicon nitride layers, and then using a process to remove the nitride layers leaving a stack of oxides layers having gaps between them.

Figure 2B:
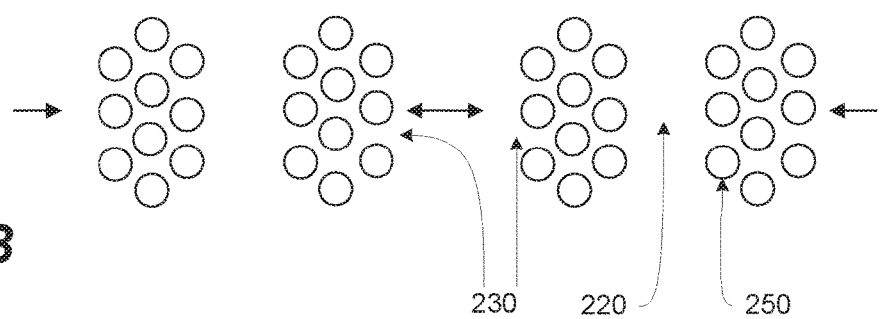
FIG. 2B presents a cross-sectional top-down view of the VNAND structure shown in side-view in FIG. 2A with the cross-section taken through the horizontal section indicated by the dashed horizontal line in FIG. 2A.

These gaps are the wordline features (also referred to in the below description as simply wordlines) to be filled with tungsten. In principle, any number of wordlines may be vertically stacked in such a VNAND structure so long as there is a technique for forming them available, as well as a technique available to successfully accomplish (substantially) void-free fills of the vertical features. Thus, for example, a VNAND stack may include between 2 and 256 horizontal wordline features, or between 8 and 128 horizontal wordline features, or between 16 and 64 horizontal wordline features, and so forth (the listed ranges understood to include the recited end points). FIG. 2B presents a cross-sectional top-down view of the same VNAND structure 200 shown in side-view in FIG. 2A with the cross-section taken through the horizontal section 260 indicated in FIG. 2A (i.e., indicated by the dashed horizontal line). The cross-section of FIG. 2B illustrates several rows of pillars 250 which are shown in FIG. 2A to run vertically from the base of semiconductor substrate 201 to the top of VNAND stack 200. In some embodiments, these pillars 250 are formed from a polysilicon material and are structurally and functionally significant to VNAND structure 200. In some applications, such polysilicon pillars may serve as gate electrodes for stacked memory cells formed by the wordlines. The top-view of FIG. 2B illustrates that the pillars 250 form constrictions in the openings 230 to wordlines 220—i.e. fluidic accessibility of wordlines 220 from vertical structure 210 via openings 230 (as indicated by the arrows in FIG. 2B) is inhibited by pillars 250. In some embodiments, the size of the horizontal gap between adjacent polysilicon pillars is between about 1 and 20 nm. This reduction in fluidic accessibility increases the difficulty of uniformly filling wordlines 220 with tungsten material.

Figure 3A:
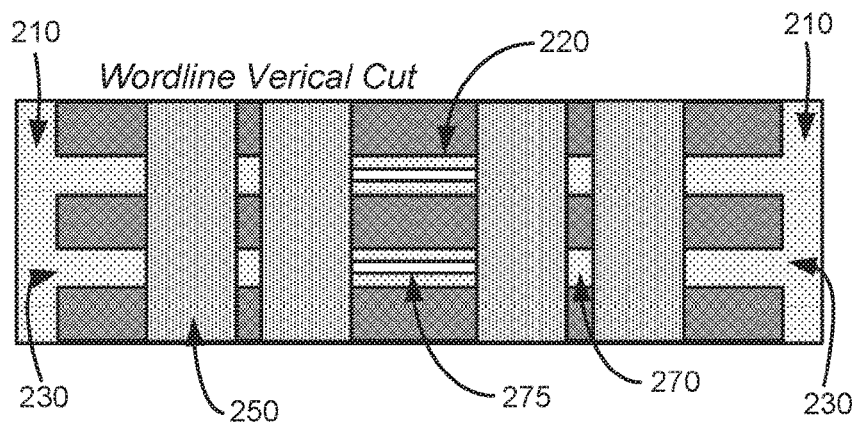
FIG. 3A exhibits a vertical cross-section (cut) of a VNAND structure similar to that shown in FIG. 2A, but in FIG. 3A focused on a single pair of wordlines and additionally schematically illustrating a tungsten fill process which resulted in the formation of voids in the wordlines.
Figure 3B:
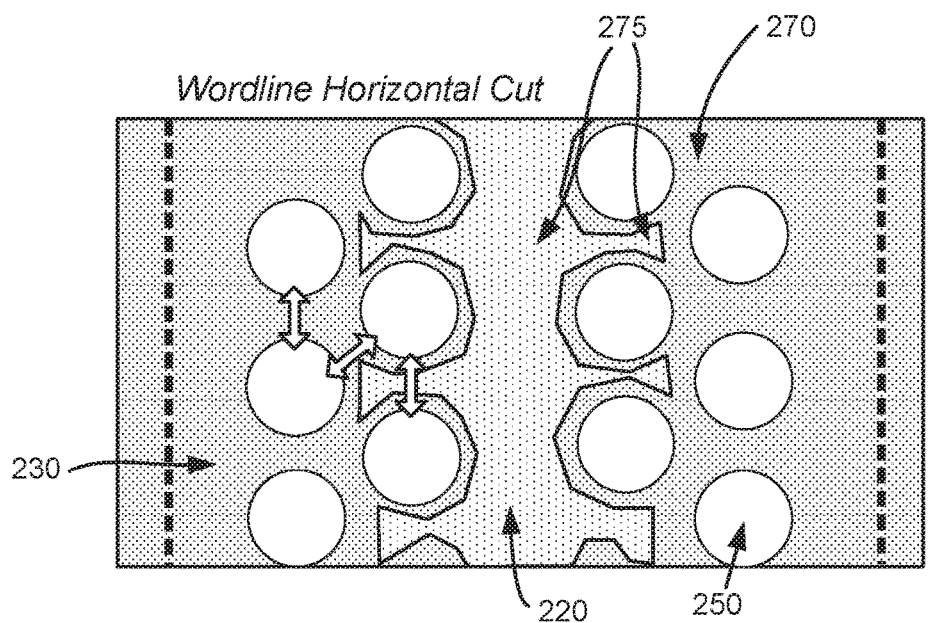
FIG. 3B exhibits a horizontal cross-section (cut) of a VNAND structure similar to that shown in FIG. 2A, and also schematically illustrating the presence of voids as in FIG. 3A.
Figure 3C:
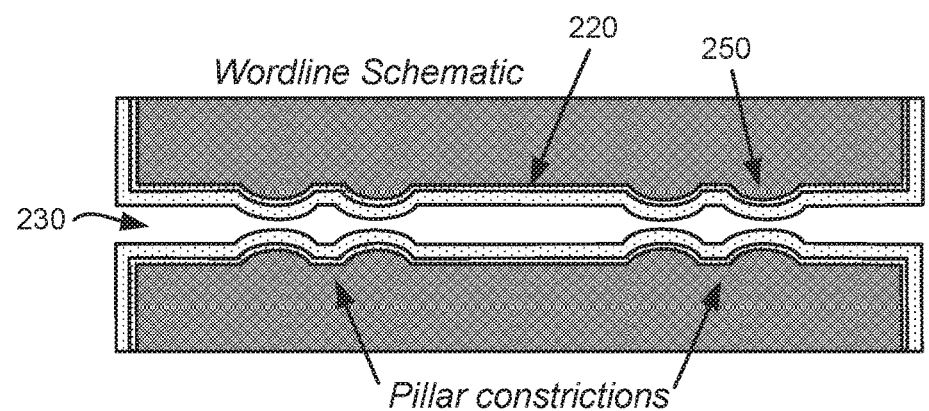
FIG. 3C exhibits a single wordline viewed cross-sectionally from above and illustrates how a generally conformal deposition of tungsten material begins to pinch-off the interior of exhibited wordline features due presence of the pillars shown in the figure.

The structure of wordlines 220 and the challenge of uniformly filling them with tungsten material due to the presence of pillars 250 is further illustrated in FIGS. 3A, 3B, and 3C. FIG. 3A exhibits a vertical cut through VNAND structure 200 similar to that shown in FIG. 2A, but here focused on a single pair of wordlines 220 and additionally schematically illustrating a tungsten fill process which resulted in the formation of a void 275 in wordlines 220. FIG. 3B also schematically illustrates the voids 270, but in this figure illustrated via a horizontal cut through pillars 250, similar to the horizontal cut exhibited in FIG. 2B. FIG. 3B illustrates the accumulation of tungsten material around the constriction-forming pillars 250, the accumulation resulting in the pinch-off of openings 230, so that no additional tungsten material can be deposited in the region of voids 270. Apparent from FIGS. 3A and 3B is that void-free tungsten fill relies on migration of sufficient quantities of deposition precursor down through vertical structure 210, through openings 220, past the constricting pillars 250, and into the furthest reaches of wordlines 220, prior to the accumulated deposition of tungsten around pillars 250 causing a pinch-off of the openings 220 and preventing further precursor migration into wordlines 230. Similarly, FIG. 3C exhibits a single wordline 230 viewed cross-sectionally from above and illustrates how a generally conformal deposition of tungsten material begins to pinch-off the interior of wordline 220 due to the fact that the significant width of pillars 250 acts to partially block, and/or narrow, and/or constrict what would otherwise be an open path through wordline 220. (It should be noted that the example in FIG. 3C can be understood as a 2-D rendering of the 3-D features of the structure of the pillar constrictions shown in FIG. 3B, thus illustrating constrictions that would be seen in a plan view rather than in a cross-sectional view.)

In depositing tungsten into the wordlines described above, low resistivity and low stress are important. However, bulk deposition processes that can provide low resistivity and low stress may result in wordline sidewall roughness. That is, tungsten film deposited on the sidewalls 240 of the 3D NAND structure may have high roughness, which can lead to problems with subsequent integration processes. In particular, when the tungsten is etched back to remove it, the roughness can be passed to the underlying and subsequently deposited layers.

Figure 4:
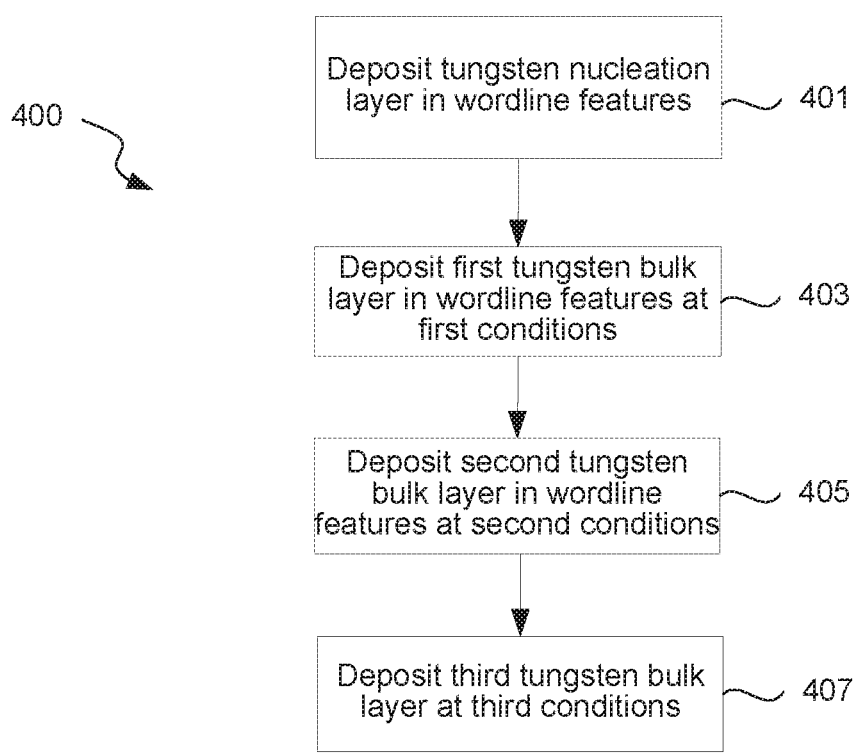
FIG. 4 shows a process flow diagram illustrating certain operations in a method of filling 3D NAND structures with tungsten or other conductive material according to various embodiments.

FIG. 4 shows a process flow diagram illustrating certain operations in a method of filling 3D NAND structures with tungsten. First, a tungsten nucleation layer may be deposited in wordline features of the 3D NAND structure (block 401). Deposition of nucleation layers may involve alternating pulses of a tungsten-containing precursor and a reducing agent. Examples of tungsten-containing precursors include tungsten fluorides ($WF_x$), tungsten chlorides ($WCl_x$), and tungsten hexacarbonyl ($W(CO)_6$). Particular examples include tungsten hexafluoride ($WF_6$), tungsten pentachloride ($WCl_5$), tungsten hexachloride ($WCl_6$), and tungsten oxyhalides (e.g., $WO_xCl_y$). Examples of reducing agents include silanes (e.g., $SiH_4$) and boranes, e.g., diborane ($B_2H_6$). In some embodiments, a nucleation layer may not be necessary.

Next a first bulk layer is deposited in the wordline features using a first set of conditions (block 403). In some embodiments, this bulk layer may be characterized as low resistivity and, in some embodiments, low stress and/or low fluorine. Because the wordline features are unfilled (with the exception of the nucleation layer if deposited), a relatively fast deposition technique may be used. In some embodiments, this involves alternating pulses of a tungsten-containing precursor and hydrogen ($H_2$) or other reducing agent to deposit the first tungsten layer in an ALD process. Purge operations may separate the pulses. Relatively short pulse times may be used for deposition to increase throughput.

In some embodiments, the tungsten-containing precursor is a fluorine-containing precursor, e.g., $WF_6$. However, other tungsten-containing precursors may be used including $WF_x$, $WCl_x$, and $W(CO)_6$, with examples including $WCl_5$, $WCl_6$, and $WO_xCl_y$ where x and y are numbers greater than 0.

Once the features begin to close off, the deposition conditions may be changed to avoid pinch-off. At operation 405, a second bulk layer is deposited using a second set of conditions. Like the first bulk layer, the second bulk layer is a low resistivity layer, and in some embodiments, a low stress and/or low fluorine layer. As with operation 403, the second bulk layer may be deposited with ALD, with the second set of conditions including one or more of different timing, flowrates, and temperatures relative to operation 403.

For example, in some embodiments, operation 405 involves increased pulse times and increased purge times relative to operation 403. In particular embodiments, tungsten-containing precursor pulse times may be increased. Increasing pulse and/or purge times can facilitate reactants diffusing into the wordlines. In some embodiments, the temperature may also be changed from operation 403 to operation 405; for example higher temperature may be used to speed reaction time. In some embodiments, a lower temperature may be used to allow the reactants to diffuse into the wordline features before reaction. In some embodiments, the second set of conditions may include a change in flowrates. For example, the flow rate of the tungsten-containing precursor and/or reducing agent may be increased.

Figure 5:
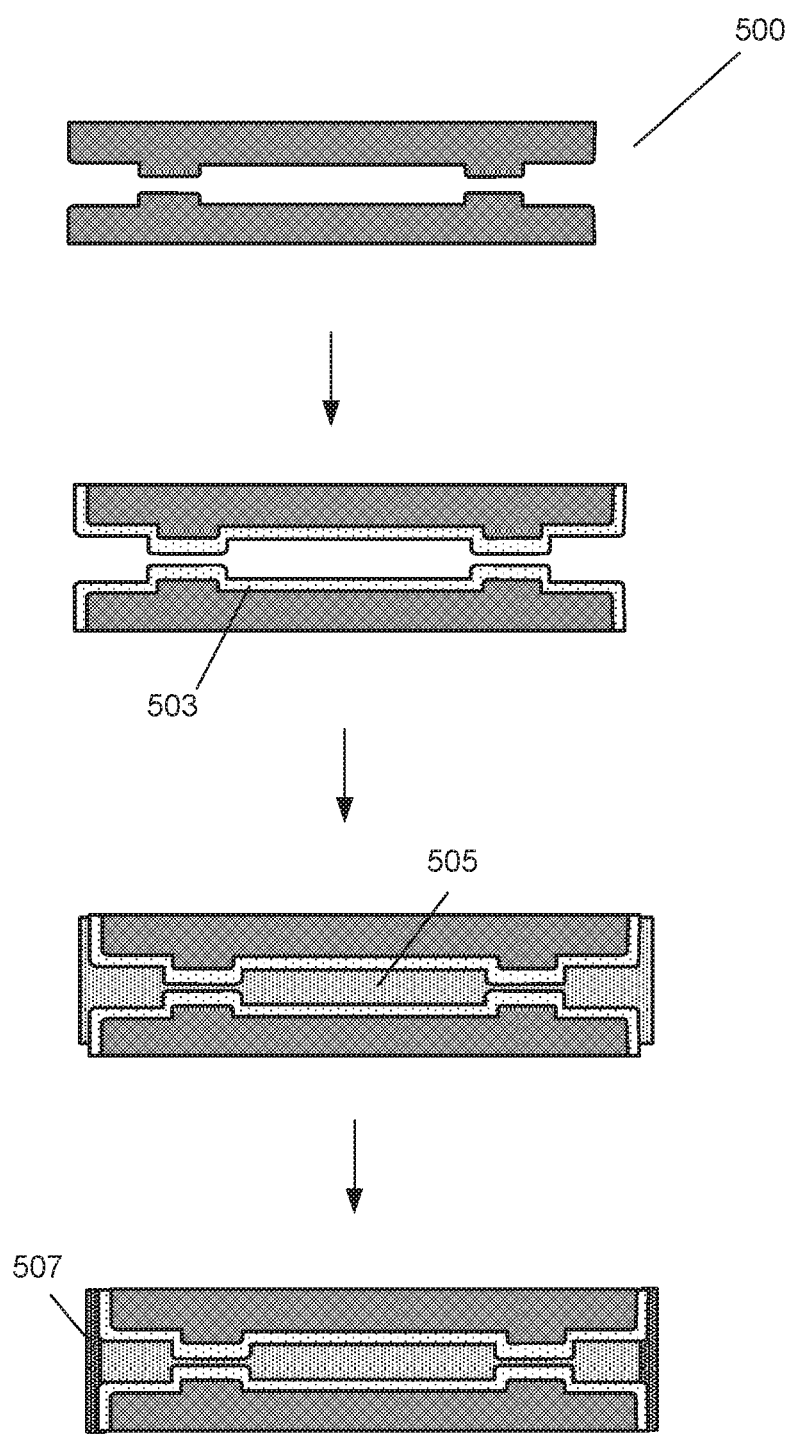
FIG. 5 provides a schematic of a single wordline of a 3D NAND structure that includes multiple bulk layers of a conductive material.

At operation 407, a third bulk layer is deposited at third conditions. This may be characterized as an overburden layer, for example deposited on sidewalls such as sidewalls 240 in the 3D NAND structure. This layer may be characterized as low roughness. Higher resistivity and fluorine concentration can be tolerated as the tungsten is to be removed. The third set of conditions can involve any one of: faster timing if ALD is used with shorter pulse times than in operation 405, using CVD instead of ALD, introducing nitrogen ($N_2$) during or between the flow of one or more reactant gases; and $B_2H_6$/$WF_6$ ALD. FIG. 5 provides a schematic of a single wordline 500 of a 3D NAND structure that includes the first bulk layer 503, the second bulk layer 505, and the third bulk layer 507.

In some embodiments, the tungsten-containing precursor may be changed in between bulk layer depositions.

Figure 6A:
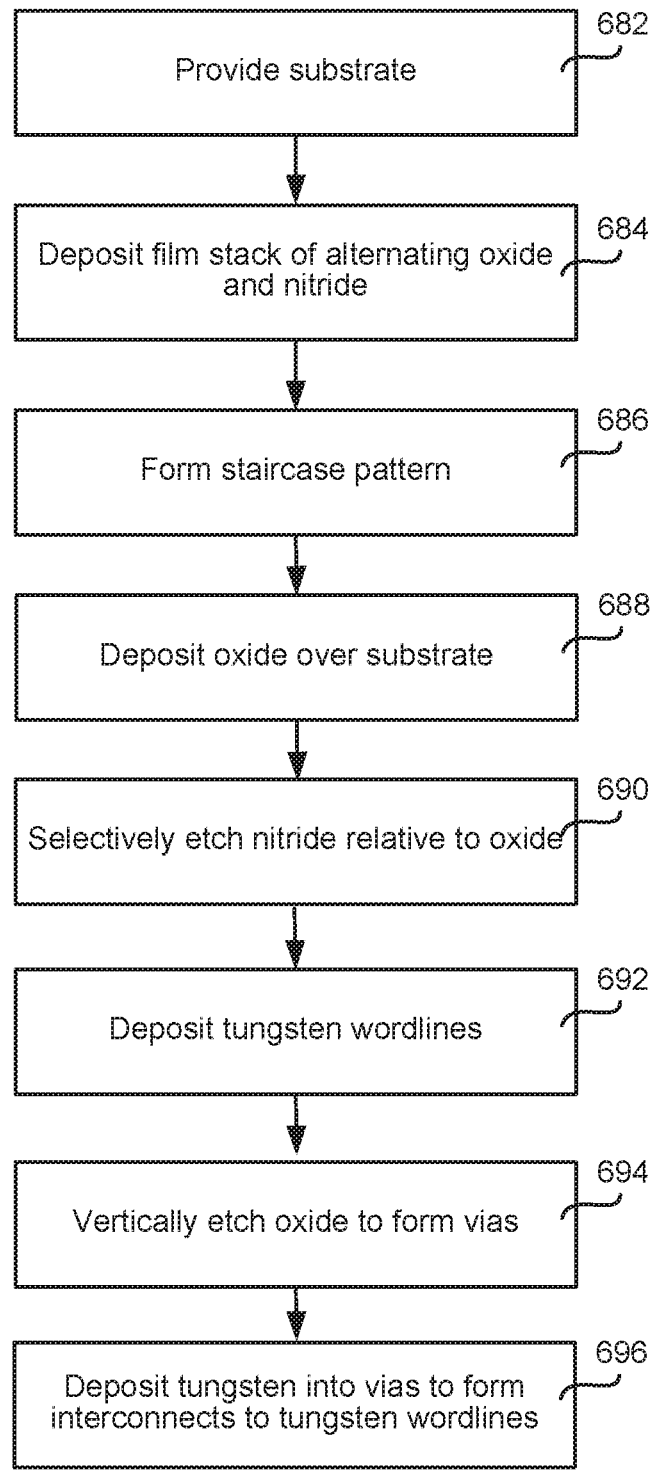
FIG. 6A shows an overall integration scheme for forming a 3D NAND structure that includes a multilayer bulk deposition process according to various embodiments.

FIG. 6A shows an overall integration scheme for forming a 3D NAND structure that includes the multilayer bulk deposition process described above. In operation 682, a substrate is provided. In various embodiments, the substrate is a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon.

In operation 684, a film stack of alternating oxide and nitride films is deposited on the substrate. In various embodiments, the oxide layer deposited is a silicon oxide layer. In various embodiments, the nitride layer deposited is a silicon nitride layer. Each oxide and nitride layer is deposited to about the same thickness, such as between about 60 nm and about 600 nm, or about 350 Å in some embodiments.

The film stack may include between 48 and 562 layers of alternating oxide and nitride layers, whereby each oxide or nitride layer constitutes one layer. The film stack including the alternating oxide and nitride layers may be referred to as an ONON stack.

Following deposition of the ONON stack, channels may be etched in the substrate. Subsequently, referring to FIG. 6A, in operation 686, a staircase pattern is formed on the substrate. A "staircase pattern" as referred to herein includes two or more steps, each step including an oxide and a nitride layer. The top layer of each set of oxide and nitride layers may be either an oxide or a nitride for formation of steps in a staircase. In some examples, the staircase pattern includes between 24 and 256 steps. The staircase pattern may be formed using a variety of patterning techniques. For example, one technique may include depositing a sacrificial layer over the substrate and masking regions of the substrate to etch each set of oxide and nitride layers to form the staircase.

Each step includes a nitride and oxide layer, and may be between about 650 nm and about 6000 nm, such as about 500 nm. This region of each step extending out from the edge of the step above it may be referred to as a "pad." In operation 688 of FIG. 6A, oxide is deposited over the substrate. In various embodiments, the oxide may be the same composition as the oxide deposited in layers of the ONON stack. The deposition temperature may be between room temperature and about 600° C. Vertical slits may be subsequently etched into the substrate after depositing oxide.

In operation 690, nitride is selectively etched relative to oxide on the substrate. Etching may be performed using a selective dry etch process in some examples. This operation removes the nitride layers from the ONON stack such that etch species flow into the vertical slit and selectively etches nitride. It will be understood that the selective etching involves etching a first material at a rate faster than etching a second material. For example, selectively etching nitride relative to oxide means nitride is etched at a faster rate than etching of oxide. Nitride is selectively etched using a wet etch process, such as by exposing the substrate to phosphoric acid ($H_3PO_4$) and/or diluted hydrofluoric acid ("DHF") or a mixture of these solutions.

Figure 6B:
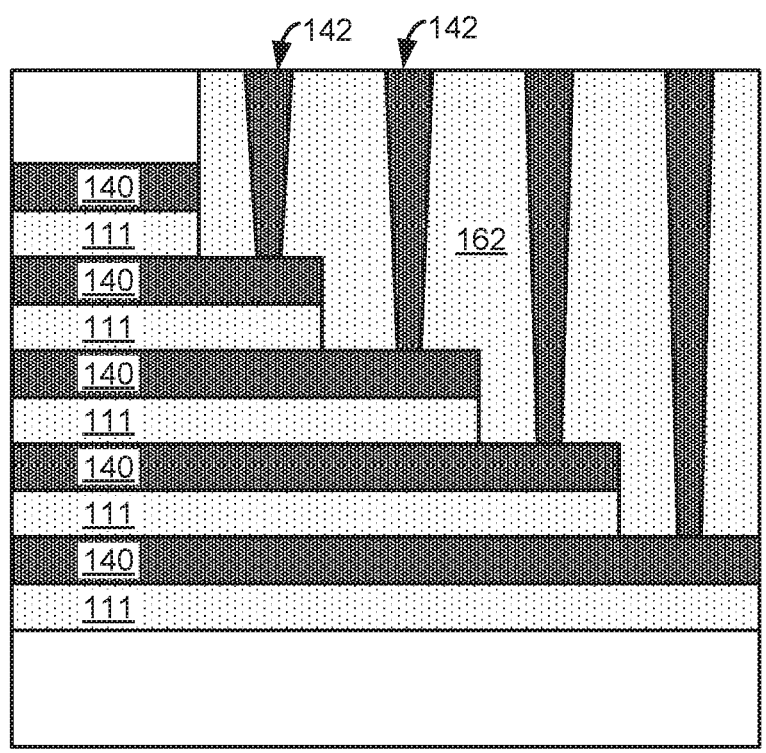
FIG. 6B shows a portion of an example resulting 3D NAND structure including conductive wordlines, oxide layers, and vias.

In operation 692, tungsten is deposited into the gaps of the substrate to form tungsten wordlines. Bulk tungsten may be deposited by a multi-layer process as described with reference to FIGS. 4 and 5. In some embodiments, a barrier layer and/or a tungsten nucleation layer is deposited prior to depositing bulk tungsten. The third bulk tungsten layer may be etched back. In operation 694, the oxide is vertically etched to form vias. The oxide may be etched by dry etching. In operation 696, tungsten is deposited in the vias to form interconnects to the tungsten wordlines. FIG. 6B shows the resulting structure including tungsten wordlines 140 and oxide layers 111, and vias 142 in oxide 162.

While FIGS. 4-6B provide an example application of multilayer bulk tungsten, the methods may be applied to fill other structures including those show in FIGS. 1a and 1b. The process may be tuned at each stage to deposit films at different speeds and having different step coverage, fluorine content, stress, and roughness. According to various embodiments, any of the multi-layer bulk layers can involve one of the following operations: 1) $H_2$/$WF_6$ ALD process; 2) $H_2$/$WF_6$ ALD process with $N_2$ co-flow; 3) $H_2$/$WF_6$ CVD process; and 4) $B_2H_6$/$WF_6$ ALD.

In some embodiments, a bulk layer is exposed to a nitrogen ($N_2$) or nitrogen-containing soak prior to deposition of the subsequent bulk layer. Such a treatment can create an interface to interrupt crystal growth such that the subsequent bulk layer regrows with smaller crystals.

In some embodiments, the methods described above may be implemented to control precursor consumption. Shorter pulse times and/or lower flow rates of a metal-containing precursor may be used to fill a structure that has relatively accessible features (e.g., as in operation 403 and/or operation 407 in FIG. 4). The relatively low consumption that results can balance out longer pulse times and/or higher flowrates used to fill relatively inaccessible parts of the structure (e.g., as in operation 405 of FIG. 4).

Substrate temperature may also be controlled to tune deposition rate, fluorine incorporation, and stress. Example temperature ranges for the deposition of bulk tungsten in 3D NAND structures range from 300° C. to 500° C.

While the above description chiefly describes multi-layer bulk tungsten layers, the methods may be implemented for feature fill of complex structures using any material with examples including molybdenum, cobalt, and ruthenium. For example, precursor consumption may be managed by using a faster deposition initially before the features become closed off, then transitioning to a second bulk layer using longer pulse times or higher flow rates.

To deposit molybdenum (Mo), Mo-containing precursors including molybdenum hexafluoride ($MoF_6$), molybdenum pentachloride ($MoCl_5$), molybdenum dichloride dioxide ($MoO_2Cl_2$), molybdenum tetrachloride oxide ($MoOCl_4$), and molybdenum hexacarbonyl ($Mo(CO)_6$) may be used.

To deposit ruthenium (Ru), Ru-precursors may be used. Examples of ruthenium precursors that may be used for oxidative reactions include (ethylbenzyl)(1-ethyl-1,4-cyclohexadienyl)Ru(0), (1-isopropyl-4-methylbenzyl)(1,3-cyclohexadienyl)Ru(0), 2,3-dimethyl-1,3-butadienyl)Ru(0)tricarbonyl, (1,3-cyclohexadienyl)Ru(0)tricarbonyl, and (cyclopentadienyl)(ethyl)Ru(II)dicarbonyl. Examples of ruthenium precursors that react with non-oxidizing reactants are bis(5-methyl-2,4-hexanediketonato)Ru(II)dicarbonyl and bis(ethylcyclopentadienyl)Ru(II).

To deposit cobalt (Co), cobalt-containing precursors including dicarbonyl cyclopentadienyl cobalt (I), cobalt carbonyl, various cobalt amidinate precursors, cobalt diazadienyl complexes, cobalt amidinate/guanidinate precursors, and combinations thereof may be used.

To deposit nickel (Ni) precursors including cyclopentadienylallylnickel (CpAllylNi) and $MeCp_2Ni$ may be used.

More generally, the methods and apparatus may be applied for feature fill of complex structures using any conductive material to deposit multiple bulk layers. Metal precursor consumption, throughput optimization, roughness control, and fill quality is improved by the multi-layer bulk deposition.

In some embodiments, a multi-layer bulk film may include more than one metal. In particular examples, molybdenum and tungsten may be used for feature fill. Referring to FIG. 5, for example, the first bulk layer 503 may be a molybdenum layer, the second bulk layer 505 an ALD tungsten layer, and the third bulk layer 507 a CVD tungsten layer.

Apparatus

Figure 7:
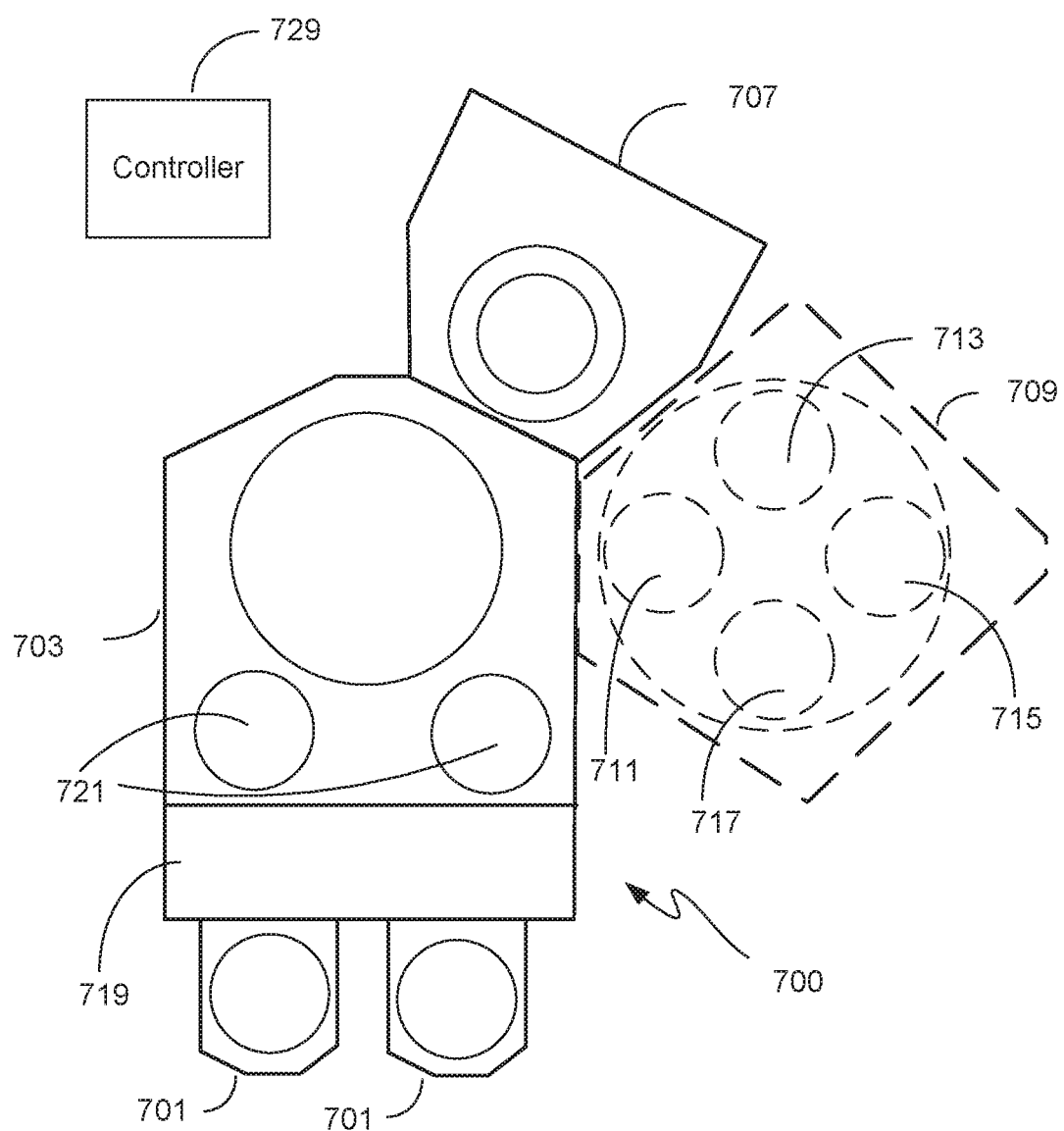
FIG. 7 is a block diagram of a processing system suitable for conducting deposition processes in accordance with embodiments described herein.

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems. The process can be performed in a single deposition station or on multiple deposition stations in parallel. FIG. 7 is a block diagram of a processing system suitable for conducting deposition processes in accordance with embodiments described herein. The system 700 includes a transfer module 703. The transfer module 703 provides a clean, pressurized environment to minimize the risk of contamination of substrates being processed as they are moved between the various reactor modules. Mounted on the transfer module 703 is a chamber 709 capable of performing PNL, ALD, and CVD deposition according to embodiments described herein. Chamber 709 may include multiple stations 711, 713, 715, and 717 that may perform these operations sequentially or in parallel. For example, chamber 709 could be configured such that station deposits a nucleation layer, and stations 713-717 each deposit a bulk layer as described above. In some embodiments, station 713 and 715 may perform ALD and station 717 performs CVD. In some embodiments, each of stations 713-717 performs ALD.

Each deposition station may include a heated wafer pedestal and a showerhead, dispersion plate or other gas inlet. Each station may also be connected to gas source. Each of temperature, gas flows and timing may be controlled independently of the other stations.

Also mounted on the transfer module 703 may be one or more single or multi-station modules 707 capable of performing plasma or chemical (non-plasma) pre-cleans. The module may also be used for various other treatments, e.g., reducing agent soaking. The system 700 also includes one or more (in this case two) wafer source modules 701 where wafers are stored before and after processing. An atmospheric robot (not shown) in the atmospheric transfer chamber 719 first removes wafers from the source modules 701 to loadlocks 721. A wafer transfer device (generally a robot arm unit) in the transfer module 703 moves the wafers from loadlocks 721 to and among the modules mounted on the transfer module 703.

In certain embodiments, a system controller 729 is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, radio frequency (RF) power levels if used, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

In some implementations, a controller 729 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 729, depending on the processing requirements and/or the type of system, may be programmed to control any of the processes disclosed herein, including the delivery of processing gases, temperature settings (e.g., heating and/or cooling), pressure settings, vacuum settings, power settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 729, in some implementations, may be a part of or coupled to a computer that is integrated with, coupled to the system, otherwise networked to the system, or a combination thereof. For example, the controller 729 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 729 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the disclosure in a single or multi-chamber semiconductor processing tool.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method of filling a 3-D structure of a partially manufactured semiconductor substrate with a conductive material, the 3-D structure comprising sidewalls, a plurality of openings in the sidewalls leading to a plurality of features having a plurality of interior regions fluidically accessible through the openings, the method comprising:
depositing a first bulk layer of the conductive material within the 3-D structure such that the first bulk layer partially fills the plurality of interior regions of the 3-D structure;
depositing a second bulk layer of the conductive material within the 3-D structure on the first bulk layer such that the second bulk layer at least partially fills the plurality of interior regions of the 3-D structure; and
depositing a third bulk layer of the conductive material within the 3-D structure on the sidewalls, wherein the first bulk layer, second bulk layer, and third bulk layer are deposited at different conditions.

2. The method of claim 1, wherein the conductive material is tungsten.

3. The method of claim 1, wherein the first and second bulk layers are deposited by atomic layer deposition (ALD) processes.

4. The method of claim 3, wherein the third bulk layer is deposited by an ALD process.

5. The method of claim 3, wherein the third bulk layer is deposited by a chemical vapor deposition (CVD) process.

6. The method of claim 3, wherein each of the ALD processes comprises sequential pulses of a metal-containing precursor and a reducing agent.

7. The method of claim 6, wherein one or more of the flow rate and the pulse time of the metal-containing precursor pulse is greater during deposition of the first bulk layer than during depositions of the second bulk layer and the third bulk layer.

8. The method of claim 1, further comprising depositing a fourth bulk layer of the conductive material on the third bulk layer.

9. The method of claim 1, wherein the conductive material is molybdenum, ruthenium, or cobalt.

10. The method of claim 1, further comprising exposing the substrate to a nitrogen ($N_2$) soak in between deposition of two of the bulk layers.

11. A method comprising:
providing a substrate to a multi-station deposition chamber;
depositing in a first station of the multi-station deposition chamber a first metal bulk layer on the substrate at a first set of conditions; transferring the substrate to a second station of the multi-station deposition chamber and depositing a second metal bulk layer on the first metal bulk layer at a second set of conditions; transferring the substrate to a third station of the multi-station deposition chamber and depositing a third metal bulk layer on the second metal bulk layer at a third set of conditions, wherein transitioning from the first set of conditions to the second set of conditions comprises one or more of: changing a metal precursor pulse time, changing a metal precursor flowrate, and changing a pedestal temperature, and transitioning from the second set of conditions to the third set of conditions comprises one or more of: changing a metal-containing precursor pulse time, changing a metal-containing precursor flowrate, and changing a pedestal temperature.

12. The method of claim 11, wherein the metal of the metal bulk layers is one of tungsten, molybdenum, cobalt, and ruthenium.

13. The method of claim 11, wherein transitioning from the first set of conditions to the second set of conditions comprises increasing a metal precursor flowrate or increasing a metal-containing precursor pulse time.

14. The method of claim 11, wherein transitioning from the first set of conditions to the second set of conditions comprises increasing a purge time.

15. The method of claim 11, wherein transitioning from the first set of conditions to the second set of conditions comprises decreasing a metal precursor flowrate or decreasing a metal-containing precursor pulse time.

16. The method of claim 11, wherein the substrate comprises a feature and the first metal bulk layer, the second metal bulk layer, and the third metal bulk layer together fill the feature.

17. A multi-station chamber comprising:
a first station comprising a first showerhead and a first pedestal;
a second station comprising a second showerhead and a second pedestal;
a third station comprising a third showerhead and a third pedestal; and a controller comprising machine-readable instructions to:
deposit in the first station of the multi-station chamber a first metal bulk layer on a substrate at a first set of conditions; transfer the substrate to the second station of the multi-station chamber and deposit a second metal bulk layer on the first metal bulk layer at a second set of conditions; transfer the substrate to the third station of the multi-station chamber and deposit a third metal bulk layer on the second metal bulk layer at a third set of conditions, wherein transitioning from the first set of conditions to the second set of conditions comprises one or more of: changing a metal precursor pulse time, changing a metal precursor flowrate, and changing a pedestal temperature, and transitioning from the second set of conditions to the third set of conditions comprises one or more of: changing a metal-containing precursor pulse time, changing a metal-containing precursor flowrate, and changing a pedestal temperature.

* * * * *